United States Patent
Lee et al.

(10) Patent No.: US 9,203,014 B2
(45) Date of Patent: Dec. 1, 2015

(54) MAGNETIC MEMORY DEVICES HAVING JUNCTION MAGNETIC LAYERS AND BUFFER LAYERS AND RELATED METHODS

(71) Applicants: Joonmyoung Lee, Suwon-si (KR); Yunjae Lee, Seoul (KR); Woojin Kim, Yongin-si (KR)

(72) Inventors: Joonmyoung Lee, Suwon-si (KR); Yunjae Lee, Seoul (KR); Woojin Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/155,725

(22) Filed: Jan. 15, 2014

(65) Prior Publication Data

US 2015/0008549 A1    Jan. 8, 2015

(30) Foreign Application Priority Data

Jul. 3, 2013  (KR) .................. 10-2013-0077782

(51) Int. Cl.
| | |
|---|---|
| *H01L 43/08* | (2006.01) |
| *H01L 43/10* | (2006.01) |
| *H01F 10/32* | (2006.01) |
| *G11C 11/16* | (2006.01) |

(52) U.S. Cl.
CPC .............. *H01L 43/10* (2013.01); *G11C 11/161* (2013.01); *H01F 10/3254* (2013.01); *H01L 43/08* (2013.01)

(58) Field of Classification Search
CPC ................................ H01L 43/10; H01L 43/08
USPC ......................................................... 257/421
See application file for complete search history.

(56) References Cited

U.S. PATENT DOCUMENTS

| | | | |
|---|---|---|---|
| 7,098,495 | B2 | 8/2006 | Sun et al. |
| 7,928,524 | B2 | 4/2011 | Kim |
| 8,063,459 | B2 | 11/2011 | Ranjan et al. |
| 8,194,443 | B2 | 6/2012 | Yamane et al. |
| 8,278,123 | B2 | 10/2012 | Choi et al. |

(Continued)

FOREIGN PATENT DOCUMENTS

| | | |
|---|---|---|
| JP | 2010-093117 | 4/2010 |
| JP | 4903277 | 3/2012 |
| JP | 2012-174709 | 9/2012 |
| KR | 1020110129624 | 12/2011 |

OTHER PUBLICATIONS

Wang et al. "In-situ characterization of rapid crystallization of amorphous CoFeB electrodes in CoFeB/MgO/CoFeB junctions during thermal annealing" Applied Physics Letter, 95: 242501, 2009 (4 pages).

(Continued)

*Primary Examiner* — Tran Tran
(74) *Attorney, Agent, or Firm* — Myers Bigel Sibley & Sajovec, P.A.

(57) ABSTRACT

A magnetic memory device may include a free magnetic structure, a tunnel barrier layer, and a pinned magnetic structure wherein the tunnel barrier layer is between the free magnetic structure and the pinned magnetic structure. The pinned magnetic structure may include first and second pinned layers and an exchange coupling layer between the first and second pinned layers. The second pinned layer may be between the first pinned layer and the tunnel barrier layer, and the second pinned layer may include a junction magnetic layer and a buffer layer between the junction magnetic layer and the exchange coupling layer. The buffer layer may include a layer of a material including a non-magnetic metallic element. Related devices, structures, and methods are also discussed.

30 Claims, 7 Drawing Sheets

(56) References Cited

U.S. PATENT DOCUMENTS

| | | |
|---|---|---|
| 8,325,448 B2 | 12/2012 | Zhang et al. |
| 2010/0096716 A1* | 4/2010 | Ranjan et al. ............ 257/421 |
| 2010/0178528 A1 | 7/2010 | Tsunekawa et al. |
| 2011/0318608 A1 | 12/2011 | Wang et al. |
| 2012/0146167 A1 | 6/2012 | Huai et al. |
| 2012/0148874 A1 | 6/2012 | Ohmori et al. |
| 2012/0218813 A1 | 8/2012 | Oh et al. |
| 2013/0028013 A1 | 1/2013 | Ikeda et al. |

OTHER PUBLICATIONS

Bandiera et al. "Comparison of Synthetic Antiferromagnets and Hard Ferromagnets as Reference Layer in Magnetic Tunnel Junctions With Perpendicular Magnetic Anisotropy" IEEE Magnetics Letters, vol. 1, 2010 (4 pages).

Ikeda et al. "A perpendicular-anisotropy CoFeB—MgO magnetic tunnel junction" Nature Materials, vol. 9, 2010, (pp. 721-724).

* cited by examiner

MAGNETIC MEMORY DEVICES HAVING JUNCTION MAGNETIC LAYERS AND BUFFER LAYERS AND RELATED METHODS

CROSS-REFERENCE TO RELATED APPLICATIONS

This U.S. non-provisional patent application claims priority under 35 U.S.C. §119 to Korean Patent Application No. 10-2013-0077782, filed on Jul. 3, 2013, in the Korean Intellectual Property Office, the entire disclosure of which is hereby incorporated herein in its entirety by reference.

BACKGROUND

Example embodiments of inventive concepts relate to memory devices, and in particular, to magnetic memory devices.

Due to demand for electronic devices with increased speed and/or reduced power consumption, semiconductor devices may require faster operating speeds and/or lower operating voltages. Magnetic memory devices have been suggested to satisfy such requirements. For example, the magnetic memory device can provide technical advantages, such as reduced latency and/or non-volatility. As a result, magnetic memory devices are emerging as next-generation memory devices.

A magnetic memory device may include a magnetic tunnel junction (MTJ). A magnetic tunnel junction may include two magnetic layers and a tunnel barrier layer interposed therebetween. Resistance of the magnetic tunnel junction may vary depending on magnetization orientations of the magnetic layers. For example, the resistance of the magnetic tunnel junction may be higher when the magnetic layers have anti-parallel magnetization orientations than when they have parallel magnetization orientations. Such a difference in resistance can be used for data storing operations of a magnetic memory device. However, more research is still needed to mass-produce magnetic memory devices.

SUMMARY

Example embodiments of inventive concepts may provide magnetic memory devices is configured to have increased magnetoresistance ratios and/or enhanced antiferromagnetic coupling between magnetic layers, and methods of fabricating the same.

According to some embodiments of inventive concepts, a magnetic memory device may include a free magnetic structure, a tunnel barrier layer, and a pinned magnetic structure wherein the tunnel barrier layer is between the free magnetic structure and the pinned magnetic structure. The pinned magnetic structure may include first and second pinned layers and an exchange coupling layer between the first and second pinned layers. The second pinned layer may be between the first pinned layer and the tunnel barrier layer, and the second pinned layer may include a junction magnetic layer and a buffer layer between the junction magnetic layer and the exchange coupling layer. The buffer layer may include a layer of a material including a non-magnetic metallic element.

The non-magnetic metallic element may have a higher atomic mass than any element in the junction magnetic layer.

The non-magnetic metallic element may have a higher melting point than any element in the junction magnetic layer.

A weight percent of the non-magnetic metallic element in the material of the buffer layer may be greater than a weight percent of the non-magnetic metallic element in the junction magnetic layer.

The non-magnetic metallic element may include at least one of tantalum (Ta), tungsten (W), niobium (Nb), titanium (Ti), chromium (Cr), Hafnium (Hf), Zirconium (Zr), Molybdenum (Mo), and/or vanadium (V).

The material of the buffer layer may further include a ferromagnetic element and a non-metallic element.

The ferromagnetic element may include at least one of cobalt (Co), iron (Fe), and/or nickel, and the non-magnetic element may include boron.

The junction magnetic layer and the buffer layer may have different crystallization characteristics. A degree of crystallinity of the junction magnetic layer may be higher than a degree of crystallinity of the buffer layer. For example, the junction magnetic layer may have a body centered cubic crystal structure and the buffer layer may have an amorphous structure.

The junction magnetic layer may include at least one of cobalt, iron, and/or alloys thereof. For example, the junction magnetic layer may include at least one of CoFeB, CoHf, Co, and/or CoZr.

The tunnel barrier layer may include magnesium oxide (MgO).

The exchange coupling layer may include at least one of ruthenium, iridium, and/or rhodium.

In addition, the free magnetic structure may be provided between a substrate and the pinned magnetic structure, or the pinned magnetic structure may be provided between a substrate and the free magnetic structure.

According to some other embodiments of inventive concepts, a magnetic memory device may include a free magnetic structure, a tunnel barrier layer, and a pinned magnetic structure wherein the tunnel barrier layer is between the free magnetic structure and the pinned magnetic structure. The pinned magnetic structure may include first and second pinned layers and an exchange coupling layer between the first and second pinned layers. The second pinned layer may be between the first pinned layer and the tunnel barrier layer. The second pinned layer may include a junction magnetic layer and a buffer layer between the junction magnetic layer and the exchange coupling layer, and the junction magnetic layer and the buffer layer may have different crystallization characteristics.

A degree of crystallinity of the junction magnetic layer may be higher than a degree of crystallinity of the buffer layer. For example, the junction magnetic layer may have a body centered cubic crystal structure and the buffer layer may have an amorphous structure.

The junction magnetic layer may include at least one of cobalt, iron, and/or alloys thereof. For example, the junction magnetic layer may include at least one of CoFeB, CoHf, Co, and/or CoZr.

The buffer layer may include a layer of a material including a non-magnetic metallic element, a ferromagnetic element, and a non-metallic element. A weight percent of the non-magnetic metallic element in the material of the buffer layer may be greater than a weight percent of the non-magnetic metallic element in the junction magnetic layer. The non-magnetic metallic element may have an atomic mass that is greater than an atomic mass of cobalt. The non-magnetic metallic element may include at least one of tantalum (Ta), tungsten (W), niobium (Nb), titanium (Ti), chromium (Cr), Hafnium (Hf), Zirconium (Zr), Molybdenum (Mo), and/or vanadium (V). The ferromagnetic element may include at least one of cobalt (Co), iron (Fe), and/or nickel, and the non-metallic element may include boron.

The tunnel barrier layer may include magnesium oxide (MgO).

The exchange coupling layer may include at least one of ruthenium, iridium, and/or rhodium.

In addition, the free magnetic structure may be between a substrate and the pinned magnetic structure, or the pinned magnetic structure may be between a substrate and the free magnetic structure.

According to still other embodiments of inventive concepts, a method of forming a magnetic memory device may include forming a free magnetic structure (FRL), forming a tunnel barrier layer on the free magnetic structure, forming an amorphous junction magnetic layer on the tunnel barrier layer, and forming an amorphous buffer layer on the amorphous junction magnetic layer. After forming the tunnel barrier layer, the amorphous junction magnetic layer, and the amorphous buffer layer, the amorphous junction magnetic layer and the amorphous buffer layer may be annealed to convert the amorphous junction magnetic layer to a crystalline junction magnetic layer while maintaining the amorphous buffer layer, so that after annealing, a degree of crystallinity of the crystalline junction magnetic layer is higher than a degree of crystallinity of the amorphous buffer layer.

After annealing, an exchange coupling layer may be formed on the crystalline junction magnetic layer, and a pinned layer may be formed on the exchange coupling layer.

Before annealing, an exchange coupling layer may be formed on the amorphous junction magnetic layer, and a pinned layer may be formed on the exchange coupling layer.

According to yet other embodiments of inventive concepts, a method of forming a magnetic memory device may include forming a pinned layer on a substrate, forming an exchange coupling layer on the pinned layer, forming an amorphous buffer layer on the exchange coupling layer, forming an amorphous junction magnetic layer on the amorphous buffer layer, and forming a tunnel barrier layer on the amorphous junction magnetic layer. The amorphous junction magnetic layer and the amorphous buffer layer may be annealed to convert the amorphous junction magnetic layer to a crystalline junction magnetic layer while maintaining the amorphous buffer layer so that a degree of crystallinity of the crystalline junction magnetic layer is higher than a degree of crystallinity of the amorphous buffer layer.

In addition, a free magnetic structure (FRL) may be formed on the tunnel barrier layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
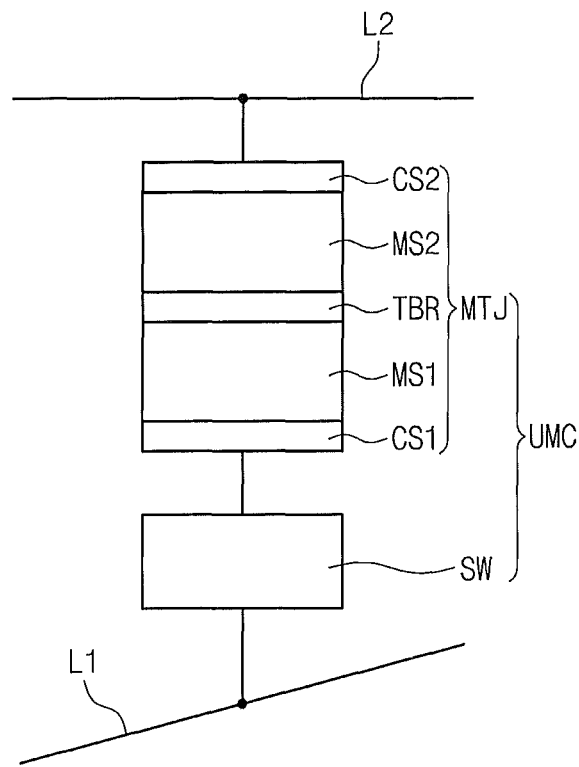
FIG. 1 is a circuit diagram illustrating a unit memory cell of a magnetic memory device according to example embodiments of inventive concepts.

It should be noted that these figures are intended to illustrate general characteristics of methods, structures, and/or materials used in certain example embodiments and to supplement the written description provided below. These drawings are not, however, to scale and may not precisely reflect precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey concepts of example embodiments to those of ordinary skill in the art. In the drawings, the thicknesses of layers and regions may be exaggerated for clarity. Like reference numerals in the drawings denote like elements, and thus their repeated description may be omitted or abbreviated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a unit memory cell of a magnetic memory device according to example embodiments of inventive concepts.

Referring to FIG. 1, a unit memory cell UMC may be disposed between first and second interconnection lines L1 and L2 crossing each other. Elements of the unit memory cell UMC may be connected in series between the first and second interconnection lines L1 and L2. The unit memory cell UMC may include a selection device SW and a magnetic tunnel junction MTJ. The selection device SW and the magnetic tunnel junction MTJ may be electrically connected in series between lines L1 and L2. In certain embodiments, one of the first and second interconnection lines L1 and L2 may be used as a word line, and the other may be used as a bit line.

The selection device SW may be configured to selectively control an electric current passing through the magnetic tunnel junction MTJ. For example, the selection device SW may be one of a diode, a pnp bipolar transistor, an npn bipolar transistor, an NMOS (n-channel metal-oxide-semiconductor) field effect transistor (FET), and a PMOS (p-channel metal-oxide-semiconductor) FET. In the case that the selection device SW is a three-terminal switching device, such as a bipolar transistor or a MOSFET, an additional interconnection line may be connected to a control electrode or gate of the selection device SW.

The magnetic tunnel junction MTJ may include a first perpendicular magnetic structure MS1, a second perpendicular magnetic structure MS2, and a tunnel barrier TBR interposed therebetween. Each of the first and second perpendicular magnetic structures MS1 and MS2 may include at least one magnetic layer made of a magnetic material. In example embodiments, as shown in FIG. 1, the magnetic tunnel junction MTJ may further include a first conductive structure Cb1 interposed between the first perpendicular magnetic structure MS1 and the selection device SW and a second conductive structure CS2 interposed between the second perpendicular magnetic structure MS2 and the second interconnection line L2.

Figure 2:
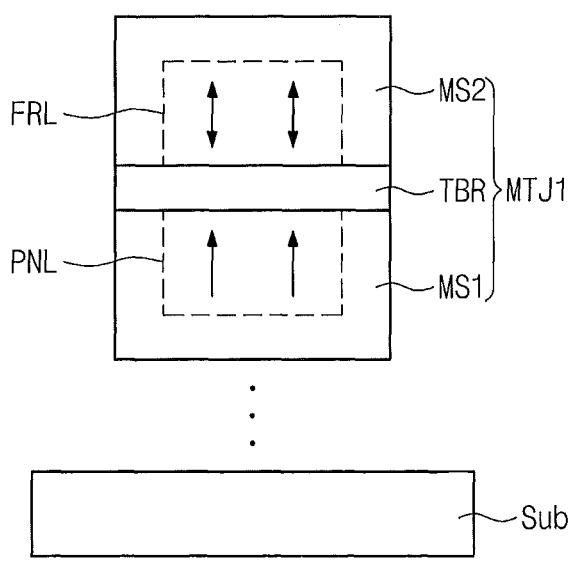
FIGS. 2 and 3 are schematic diagrams illustrating magnetic tunnel junctions according to example embodiments of inventive concepts.
Figure 3:
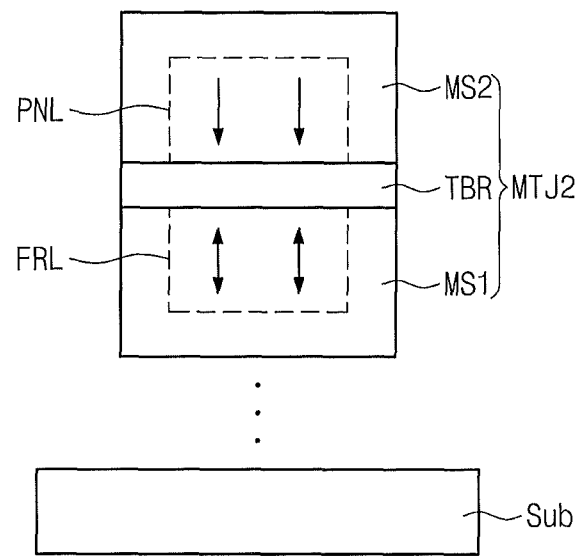

FIGS. 2 and 3 are schematic diagrams illustrating magnetic tunnel junctions according to example embodiments of inventive concepts. One of the magnetic layers of the first and second perpendicular magnetic structures MS1 and MS2 may be configured to have a fixed magnetization direction, which is not changed by an external magnetic field generated under usual environments. In the present specification, for convenience in description, a term 'reference magnetic structure PNL' will be used to represent the magnetic layer having such a fixed magnetization property (also referred to as a pinned magnetic structure). By contrast, the other of the magnetic layers of the first and second perpendicular magnetic structures MS1 and MS2 may be configured to have a magnetization direction which can be switched by applying an external magnetic field thereto. Hereinafter, a term 'free magnetic structure FRL' will be used to represent a magnetic layer having such a switchable magnetization property. For example, as shown in FIGS. 2 and 3, the magnetic tunnel junction MTJ may include at least one free magnetic structure FRL and at least one reference magnetic structure PNL separated by the tunnel barrier TBR.

Electrical resistance of the magnetic tunnel junction MTJ may be sensitive to a relative orientation of magnetization directions of the free and reference magnetic structures FRL and PNL. For example, the electrical resistance of the magnetic tunnel junction MTJ may be far greater when the relative orientation is antiparallel than when the relative orientation is parallel. This means that the electrical resistance of the magnetic tunnel junction MTJ can be controlled by changing the magnetization direction of the free magnetic structure FRL. Magnetic memory devices according to embodiments of inventive concepts may be realized based on this data storing mechanism.

As shown in FIGS. 2 and 3, the first and second perpendicular magnetic structures MS1 and MS2 of the magnetic tunnel junction MTJ may be sequentially formed on a substrate Sub. In this case, according to a relative configuration between the free magnetic structure FRL and the substrate Sub and/or a forming order of the free and reference magnetic structures FRL and PNL, the magnetic tunnel junction MTJ may be, for example, classified into two types: (a) a first type of magnetic tunnel junction MTJ1 configured in such a way that the first and second perpendicular magnetic structures MS1 and MS2 include the reference and free magnetic structures PNL and FRL, respectively, as shown in FIG. 2, and (b) a second type of magnetic tunnel junction MTJ2 configured in such a way that the first and second perpendicular magnetic structures MS1 and MS2 include the free and reference magnetic structures FRL and PNL, respectively, as shown in FIG. 3.

Figure 4:
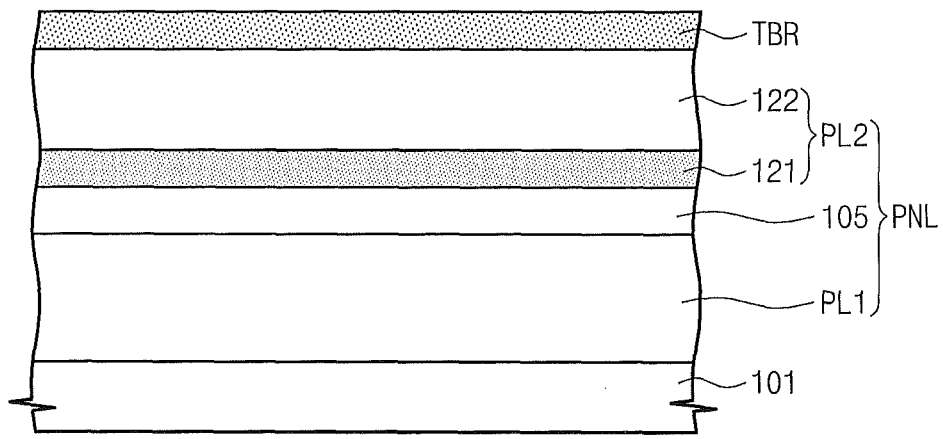
FIG. 4 is a sectional view illustrating a reference magnetic structure, which may constitute a portion of a magnetic tunnel junction, according to example embodiments of inventive concepts.

FIG. 4 is a sectional view illustrating a reference magnetic structure, which may constitute a portion of a magnetic tunnel junction, according to example embodiments of inventive concepts.

Referring to FIG. 4, the reference magnetic structure PNL, according to example embodiments of inventive concepts, may include a first sub-layer, a first exchange-coupling layer 105, and a second sub-layer provided between a seed layer 101 and the tunnel barrier TBR. For example, the first sub-layer may be a first pinned layer PL1, and the second sub-layer may be a second pinned layer PL2. In present embodiments, the reference magnetic structure PNL may be a portion of the first-type magnetic tunnel junction MTJ1 shown in FIG. 2.

The seed layer 101 may include metal atoms configured in a hexagonal close packed (HCP) lattice. For example, the seed layer 101 may include ruthenium (Ru) and/or titanium (Ti). The seed layer 101 may be formed to have a thickness ranging from 10 Å (Angstroms) to 100 Å (Angstroms). In other embodiments, the seed layer 101 may include metal atoms configured in a face-centered cubic (FCC) lattice. For example, the seed layer 101 may include at least one of platinum (Pt), palladium (Pd), gold (Au), silver (Ag), copper (Cu), or aluminum (Al). The seed layer 101 may include a single layer or a plurality of layers, at least one of which has a different crystal structure from that of the others.

The tunnel barrier TBR may include at least one of an oxide of magnesium (Mg), titanium (Ti), aluminum (Al), magnesium-zinc (MgZn), and/or magnesium-boron (MgB) and/or a nitride of titanium (Ti) and/or vanadium (V). For example, the tunnel barrier TBR may be formed of a magnesium oxide (MgO) layer. Alternatively, the tunnel barrier TBR may include a plurality of layers. For example, the tunnel barrier TBR may include one of an oxide of magnesium (Mg), titanium (Ti), aluminum (Al), magnesium-zinc (MgZn), and/or magnesium-boron (MgB) and one of a nitride of titanium (Ti) and/or vanadium (V).

The first pinned layer PL1 may be formed of a magnetic material exhibiting an intrinsic perpendicular magnetization property (hereinafter, referred as to a "perpendicular magnetization material"). Here, the intrinsic perpendicular magnetization property means that a magnetization direction of a magnetic layer is oriented parallel to its thickness direction or perpendicular to its main surface, when there is no external magnetic field applied thereto. For example, in the case that a magnetic layer with the perpendicular magnetization property is formed on a substrate, a magnetization direction of the magnetic layer may be substantially perpendicular to a top surface of the substrate.

For the first pinned layer PL1, the intrinsic perpendicular magnetization property may be realized by a single-layered or multi-layered structure provided with at least one perpendicular magnetization material containing cobalt. In example embodiments, the first pinned layer PL1 may be a single-layered or multi-layered structure including at least one of cobalt-platinum alloys or cobalt-platinum alloys added with an element X, where the element X may be at least one of boron, ruthenium, chromium, tantalum, and/or oxide. In other embodiments, the first pinned layer PL1 may be provided in the form of a multi-layered structure, in which cobalt-containing layers and precious metal layers are alternatingly and repeatedly stacked. Each cobalt-containing layer may be a layer formed of cobalt, cobalt iron, cobalt nickel, and/or cobalt chromium, and each precious metal layer may be a layer formed of platinum and/or palladium. In still other embodiments, the first pinned layer PL1 may be provided in the form of a multi-layered structure including at least one of the materials (e.g., the cobalt-platinum alloys or the cobalt-platinum alloys added with the element X) enumerated in the example embodiments and at least one of the materials (e.g., cobalt, cobalt iron, cobalt nickel, cobalt chromium, platinum, and/or palladium) enumerated in the other embodiments.

In example embodiments, the first pinned layer PL1 may have a thickness ranging from about 20 Å (Angstroms) to about 80 Å (Angstroms), or more particularly, ranging from about 30 Å (Angstroms) to about 55 Å (Angstroms). Intrinsic perpendicular magnetization materials for the first pinned layer PL1 are described by example to provide better understanding of inventive concepts, but example embodiments of inventive concepts may not be limited thereto. For example, the first pinned layer PL1 may include at least one of: a) CoFeTb, in which the relative content of Tb is 10% or more; b) CoFeGd, in which the relative content of Gd is 10% or more; c) CoFeDy; d) FePt with the $L1_0$ structure; e) FePd with the $L1_0$ structure; f) CoPd with the $L1_0$ structure; g) CoPt with the $L1_0$ or $L1_1$ structure; h) CoPt with the hexagonal close packing (HCP) structure; i) alloys containing at least one of materials presented in items of a) to h); and/or j) a multi-layered structure including magnetic and non-magnetic layers alternatingly stacked. The multi-layered structure including the alternatingly-stacked magnetic and non-magnetic layers may include at least one of (Co/Pt)n, (CoFe/Pt)n, (CoFe/Pd)n, (CoP)n, (Co/Ni)n, (CoNi/Pt)n, (CoCr/Pt)n, and/or (CoCr/Pd)n, where the subscript n denotes the stacking number. In certain embodiments, the first pinned layer PL1 may further include a cobalt layer or a cobalt-rich layer disposed to be in contact with the first exchange-coupling layer 105.

The first exchange-coupling layer 105 may be formed of at least one of ruthenium, iridium, and/or rhodium. According to example embodiments of inventive concepts, the second pinned layer PL2 may be antiferromagnetically exchange-coupled to the first pinned layer PL1 through the first exchange-coupling layer 105, thereby having a magnetization direction parallel to a thickness direction thereof. A thickness of the first exchange-coupling layer 105 may be controlled in such a way that the second pinned layer PL2 can have a perpendicular magnetization that is antiparallel to the magnetization direction of the first pinned layer PL1. For example, the thickness of the first exchange-coupling layer 105 may range from about 2 Å (Angstroms) to about 10 Å (Angstroms).

The second pinned layer PL2 may include a first junction magnetic layer 122 in contact with the tunnel barrier TBR and a first buffer layer 121 between the first junction magnetic layer 122 and the first exchange-coupling layer 105. The first junction magnetic layer 122 may be formed of a magnetic material exhibiting an intrinsic in-plane magnetization property (hereinafter, referred as to an "intrinsic in-plane magnetization material"). Here, the intrinsic in-plane magnetization property means that a magnetization direction of a magnetic layer is oriented parallel to a longitudinal direction thereof, when there is no external magnetic field applied thereto. For example, in the case that a magnetic layer with the intrinsic in-plane magnetization property is formed on a substrate, a magnetization direction of the magnetic layer may be oriented substantially parallel to the top surface of the substrate. In other words, the first junction magnetic layer 122 may have a magnetization direction oriented parallel to a surface thereof having the largest area, when there is no external magnetic field applied thereto.

In example embodiments, the intrinsic in-plane magnetization property of the first junction magnetic layer 122 may be realized by a single-layered or multi-layered structure including at least one of cobalt, iron, or alloys thereof. For example, the first junction magnetic layer 122 may be a single-layered or multi-layered structure including at least one of CoFeB, CoHf, Co, and/or CoZr. Alternatively, the first junction magnetic layer 122 may be provided in the form of a dual-layered structure including a Co layer and a CoHf layer or a dual-layered structure including a CoFeBTa layer and a CoFeB layer. Intrinsic in-plane magnetization materials are described as examples for the first junction magnetic layer 122 to provide better understanding of inventive concepts, but example embodiments of inventive concepts may not be limited thereto. In certain embodiments, the first junction magnetic layer 122 may have a thickness ranging from about 7 Å (Angstroms) to about 25 Å (Angstroms), or more particularly, from about 10 Å (Angstroms) to about 17 Å (Angstroms).

An external factor may change the magnetization direction of the first junction magnetic layer 122 from the in-plane state to the perpendicular state. For example, the first junction magnetic layer 122 may be formed to be in contact with the tunnel barrier TBR, and as the result of such a contact, the first junction magnetic layer 122 may exhibit the perpendicular magnetization direction. In that the tunnel barrier TBR serves as an external factor changing the magnetization direction of the first junction magnetic layer 122, the first junction magnetic layer 122 may be described to have an extrinsic perpendicular magnetization property. In other words, the first junction magnetic layer 122 may be an extrinsic perpendicular magnetization structure.

In the case where the first junction magnetic layer 122 is formed to be in contact with the tunnel barrier TBR, the first junction magnetic layer 122 may exhibit the extrinsic perpendicular magnetization property or serve as the extrinsic perpendicular magnetization structure, due to interface anisotropy at an interface therebetween. There are various causes for the interface anisotropy. For example, in the case where the tunnel barrier TBR includes MgO and the first junction magnetic layer 122 includes CoFeB, the interface anisotropy may result from bonding between oxygen atoms in the tunnel barrier TBR and iron atoms in the first junction magnetic layer 122. The bonding between oxygen and iron atoms may be enhanced when a nonmetallic element (e.g., boron) is exhausted from the first junction magnetic layer 122 through the interface between the tunnel barrier TBR and the first junction magnetic layer 122.

The interface anisotropy of the first junction magnetic layer 122 may be realized by performing an additional thermal treatment process, which may be performed after a deposition of the first junction magnetic layer 122. For example, the first junction magnetic layer 122 may include at least a portion having an amorphous structure, right after it is deposited, and by performing the thermal treatment process, the first junction magnetic layer 122 may be transformed to have the extrinsic perpendicular magnetization property. During the thermal treatment process, a crystal structure of the first junction magnetic layer 122 may be changed depending of that of the tunnel barrier TBR. For example, with the tunnel barrier TBR having a NaCl crystal structure, the crystal structure of the first junction magnetic layer 122 may be changed to have a body-centered cubic structure resembling the NaCl crystal structure. In other words, <001> crystal planes of the tunnel barrier TBR and the first junction magnetic layer 122 may be in contact with each other, thereby forming an interface. The lattice matching at the interface between the tunnel barrier TBR and the first junction magnetic layer 122 may contribute to enhance a magnetoresistance ratio of the magnetic tunnel junction.

The first buffer layer 121 may include a material, whose degree of crystallinity (hereinafter, crystallinity) is lower than that of the first junction magnetic layer 122. Even when two layers are formed under the same condition, one of them may be less crystallized than the other, and in the present specification, a term "low crystallinity" will be used to represent such a crystallization property of the former. Hereinafter, the first buffer layer 121 will be described in more detail with reference to FIGS. 5 and 6.

Figure 5:
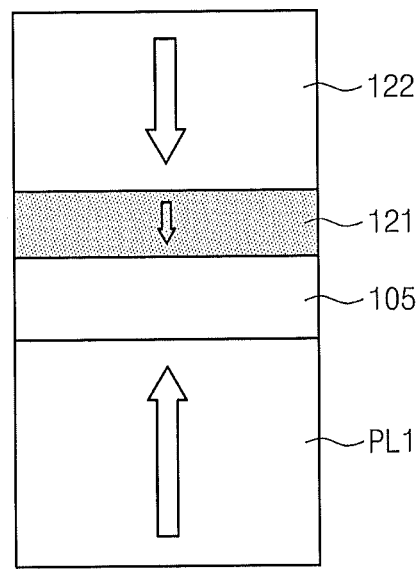
FIG. 5 is a schematic diagram illustrating a buffer layer according to example embodiments of inventive concepts.

FIG. 5 is a schematic diagram illustrating a buffer layer according to example embodiments of inventive concepts. In present embodiments, the first buffer layer 121 may be configured to have a magnetization direction that is parallel to that of the first junction magnetic layer 122. The first buffer layer 121 and the first junction magnetic layer 122 may be antiferromagnetically coupled to the first pinned layer PL1. The first buffer layer 121 may have a saturation magnetization that is smaller than that of the first junction magnetic layer 122. For example, the first buffer layer 121 may include at least one of materials made of a ferromagnetic element, a nonmetallic element, and/or a non-magnetic metallic element. Further, the first buffer layer 121 may be configured in such a way that a ratio (e.g., in weight percent or wt %) of the non-magnetic metallic element to the whole is higher than that of the first junction magnetic layer 122. The non-magnetic metallic element may be an element, whose atomic mass is greater than that of cobalt (Co). For example, the non-magnetic metallic element may include at least one of Ta, W, Nb, Ti, Cr, Hf, Zr, Mo, and/or V. The ferromagnetic element may include at least one of cobalt (Co), iron (Fe), and/or nickel (Ni). The nonmetallic element may be boron (B). In example embodiments, the first buffer layer 121 may include a layer made of CoFeBTa.

The first buffer layer 121 may be formed in such a way that a ratio of the non-magnetic metallic element to the whole ranges from about 3 wt % (weight percent) to about 30 wt % (weight percent). In the case where the ratio of the non-magnetic metallic element is lower than 3 wt % (weight percent), it may be difficult to reduce the crystallinity of the first buffer layer 121. In the case where the ratio of the non-magnetic metallic element is higher than 30 wt % (weight percent), the first buffer layer 121 may exhibit an enhanced non-magnetic property, and thus, an exchange coupling between the first junction magnetic layer 122 and the first pinned layer PL1 may be weakened. This embodiment, in which the ratio is higher than 30 wt % (weight percent), will be described with reference to FIG. 7.

Due to the presence of the first buffer layer 121 with low crystallinity, it is possible to prevent crystal structures of the first exchange-coupling layer 105 and the first pinned layer PL 1 from being transferred to the first junction magnetic layer 122 by the thermal treatment process. For example, if the first exchange-coupling layer 105 is relatively thinner than the first pinned layer PL1, a crystal structure of the first pinned layer PL1 may be transferred to the first junction magnetic layer 122 through the first exchange-coupling layer 105. Such a transfer of the crystal structure of the first pinned layer PL1 may deteriorate a lattice matching property at the interface between the tunnel barrier TBR and the first junction magnetic layer 122. For example, in the case where the first pinned layer PL1 includes CoPt with $L1_1$ structure and the first buffer layer 121 is not provided, at least a portion of the first junction magnetic layer 122 may be affected by the crystal structure of the first pinned layer PL1 and may be transformed to have a FCC structure. This may lead to deterioration of a lattice matching property at the interface between the first pinned layer PL1 and the tunnel barrier TBR, and thus, the magnetic memory device may have a reduced magnetoresistance ratio, and a SAF coupling between magnetic layers therein may be weakened.

The first buffer layer 121 may have a crystal structure different from that of the first junction magnetic layer 122. For example, although at least a portion of the first buffer layer 121 has an amorphous structure right after its deposition, it may be crystallized during the thermal treatment process, due to the presence of the first pinned layer PL1. In example embodiments, the first buffer layer 121 may have an atomic packing factor (APF) higher than that of the first junction magnetic layer 122. For example, at least a portion of the first buffer layer 121 may have a FCC structure, while at least a portion of the first junction magnetic layer 122 may have a BCC (body centered cubic) structure. However, the crystal structure of the first buffer layer 121 may not be limited thereto and may be changed depending on the crystal structure of the first pinned layer PL1.

During the thermal treatment process, the first buffer layer 121 may absorb a nonmetallic element (e.g., boron) from the first junction magnetic layer 122, and thus, the first junction magnetic layer 122 may have an enhanced interface anisotropy property. In example embodiments, the first buffer layer 121 may have a boron concentration higher than that of the first junction magnetic layer 122.

Figure 6:
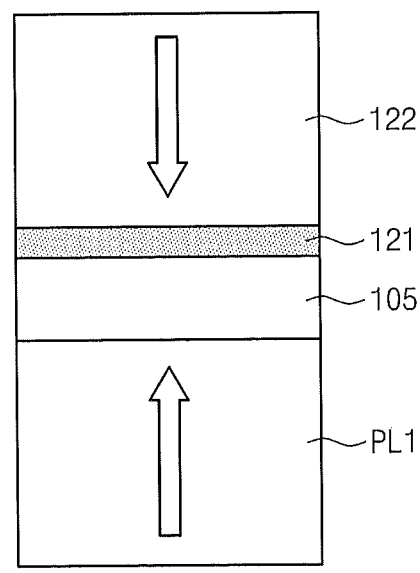
FIG. 6 is a schematic diagram illustrating a buffer layer according to other example embodiments of inventive concepts.

FIG. 6 is a schematic diagram provided to describe a buffer layer according to other example embodiments of inventive concepts. In present embodiments, the first buffer layer 121 may be a non-magnetic layer, whose thickness is less than about half that of the first exchange-coupling layer 105. For example, the first buffer layer 121 may have a thickness of about 5 Å (Angstroms) or less.

In example embodiments, the first buffer layer 121 may be an amorphous tantalum layer, an amorphous platinum layer, and/or an amorphous titanium nitride layer. In other example embodiments, the first buffer layer 121 may include at least one of the following materials including a ferromagnetic element, a nonmetallic element, and/or a non-magnetic metallic element. Further, the first buffer layer 121 may be configured in such a way that a ratio, in weight percent, of the non-magnetic metallic element to the whole is higher than about 30 wt % (weight percent). For example, the first buffer layer 121 may include a layer of CoFeBTa, in which tantalum (Ta) of about 30 wt % (weight percent) or higher is contained.

Figure 7:
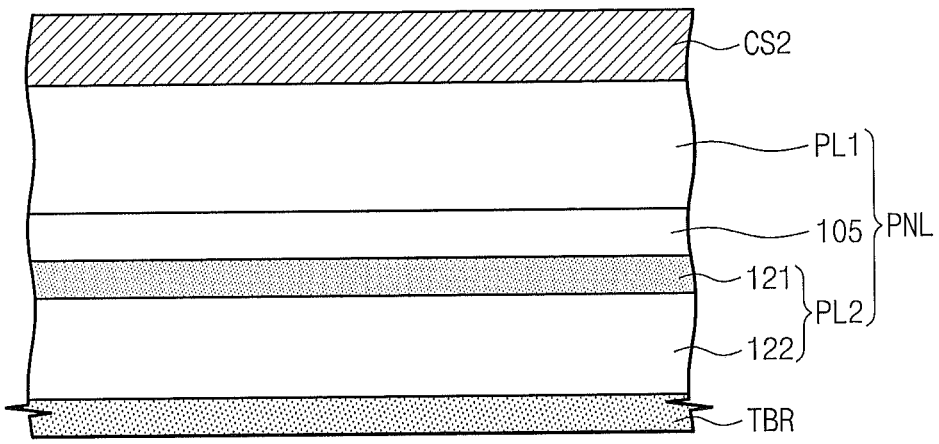
FIG. 7 is a sectional view illustrating a reference layer, which may constitute a portion of a magnetic tunnel junction, according to other example embodiments of inventive concepts.

FIG. 7 is a sectional view provided to describe a reference layer, which may constitute a portion of a magnetic tunnel junction, according to other example embodiments of inventive concepts. Referring to FIG. 7, a reference layer, according to other example embodiments of inventive concepts, may include the second pinned layer PL2, the first exchange-coupling layer 105, and the first pinned layer PL1 that are sequentially provided between the tunnel barrier TBR and the second conductive structure CS2. The reference layer may be used as a portion of the second type of the magnetic tunnel junction MTJ2 described with reference to FIG. 3. The first and second pinned layers PL1 and PL2 may be configured to have substantially the same features as those of FIG. 6, and thus, a detailed description thereof will be reduced or omitted.

According to example embodiments of inventive concepts, it may be possible to prevent/reduce the junction magnetic layer from being affected by a crystal structure of the first pinned layer. Further, it may be possible to enhance lattice matching at the interface between the junction magnetic layer and the tunnel barrier. Accordingly, the magnetic memory device can be configured to have an increased magnetoresistance ratio and an increased exchange coupling strength between the magnetic layers.

FIGS. 8 through 11 are sectional views provided to describe a free layer, which may constitute a portion of a magnetic tunnel junction, according to example embodiments of inventive concepts.

Figure 8:
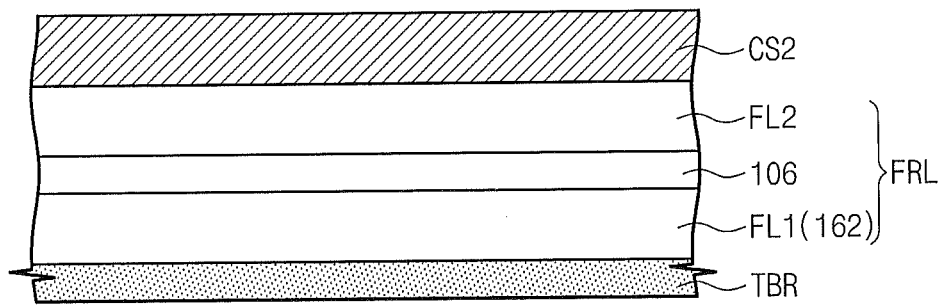
FIGS. 8 through 11 are sectional views illustrating a free layer, which may constitute a portion of a magnetic tunnel junction, according to example embodiments of inventive concepts.
Figure 9:
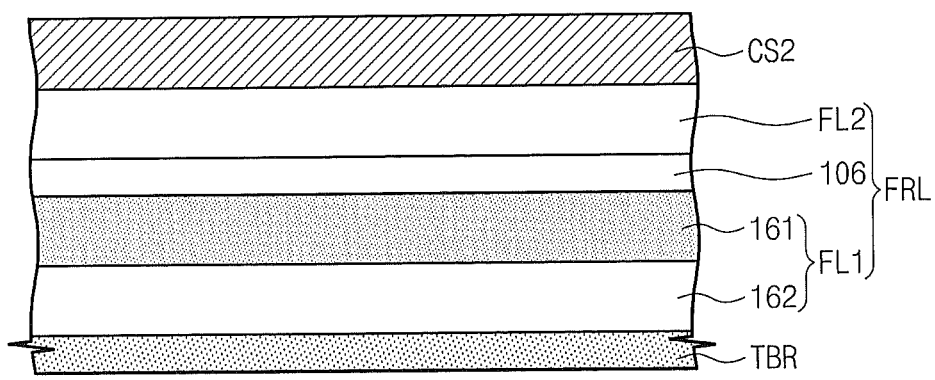

Sectional views of FIGS. 8 and 9 illustrate a free layer constituting the first-type magnetic tunnel junction MTJ1 of FIG. 2. The free magnetic structure FRL may include the first free layer FL1, a second exchange-coupling layer 106, and the second free layer FL2 that are sequentially stacked between the tunnel barrier TBR and the second conductive structure CS2. The first and second free layers FL1 and FL2 may be antiferromagnetically exchange-coupled to each other through the second exchange-coupling layer 106.

The first free layer FL1 may include a second junction magnetic layer 162 in contact with the tunnel barrier TBR. The second junction magnetic layer 162 may be formed of a magnetic material having the intrinsic in-plane magnetization property. In example embodiments, the intrinsic in-plane magnetization property of the second junction magnetic layer 162 may be realized by a single-layered or multi-layered structure including at least one of cobalt, iron, or alloys thereof. For example, the second junction magnetic layer 162 may be a single-layered or multi-layered structure including at least one of CoFeB, CoHf, Co, and/or CoZr. Alternatively, the second junction magnetic layer 162 may be provided in the form of a dual-layered structure including a Co layer and a CoHf layer or a dual-layered structure including a CoFeBTa layer and a CoFeB layer.

An external factor may change the magnetization direction of the second junction magnetic layer 162 from the in-plane state to the perpendicular state. For example, the second junction magnetic layer 162 may be formed to be in contact with the tunnel barrier TBR, and in this case, the second junction magnetic layer 162 may exhibit the extrinsic perpendicular magnetization property or serve as the extrinsic perpendicular magnetization structure, due to interface anisotropy at an interface therebetween.

The second exchange-coupling layer 106 may be a non-magnetic metal layer. For example, the second exchange-coupling layer 106 may be formed of at least one of tantalum, ruthenium, iridium, and/or rhodium. The second free layer FL2 may contain the same material as the first free layer FL1. For example, the free magnetic structure FRL may include a pair of free layers FL1 and FL2, which may be formed of cobalt-iron-boron (CoFeB) alloy, and the second exchange-coupling layer 106 interposed therebetween and formed of tantalum.

In other embodiments, the second free layer FL2 may be formed of a magnetic material having the intrinsic perpendicular magnetization property. The intrinsic perpendicular magnetization property may be realized by a single-layered or multi-layered structure including at least one of cobalt-containing perpendicular magnetization materials. For example, the second free layer FL2 may be a single-layered or multi-layered structure including a cobalt-platinum alloy or cobalt-platinum alloys added with an element X, where the element X is at least one of boron, ruthenium, chromium, tantalum, or oxide. Alternatively, the second free layer FL2 may be provided in the form of a multi-layered structure including cobalt-containing layers and noble metal layers alternatingly stacked on each other. The cobalt-containing layers may be formed of one of cobalt, cobalt iron, cobalt nickel, and cobalt chromium, and the noble metal layers may be formed of one of platinum and palladium. In certain embodiments, the second free layer FL2 may be provided in the form of a multi-layered structure including at least one of the materials (e.g., the cobalt-platinum alloy or cobalt-platinum alloys added with an element X) and at least one of the materials (e.g., cobalt, cobalt iron, cobalt nickel, cobalt chromium, platinum, and/or palladium) enumerated above.

In example embodiments, as shown in FIG. 8, the second junction magnetic layer 162 may be in contact with the second exchange-coupling layer 106. In other embodiments, as shown in FIG. 9, the first free layer FL1 may include a second buffer layer 161 between the second exchange-coupling layer 106 and the second junction magnetic layer 162. Hereinafter, the second buffer layer 161 will be described in more detail.

The second buffer layer 161 may include a material having a crystallinity that is lower than that of the second junction magnetic layer 162. In example embodiments, the second buffer layer 161 may have a magnetization direction that is parallel to that of the second junction magnetic layer 162. The second buffer layer 161 may have a saturation magnetization that is smaller than that of the second junction magnetic layer 162. For example, the second buffer layer 161 may include a ferromagnetic element, a nonmetallic element, and/or a non-magnetic metallic element. Further, the second buffer layer 161 may be configured in such a way that a ratio (e.g., in weight percent) of the non-magnetic metallic element to the whole is higher than that of the second junction magnetic layer 162. The non-magnetic metallic element may be an element having an atomic mass that is greater than that of cobalt (Co). For example, the non-magnetic metallic element may include at least one of Ta, W, Nb, Ti, Cr, Hf, Zr, Mo, and/or V. The ferromagnetic element may be at least one of cobalt (Co), iron (Fe), and/or nickel (Ni). The nonmetallic element may be boron (B). In example embodiments, the second buffer layer 161 may include a layer made of CoFeBTa.

The second buffer layer 161 may be formed in such a way that a ratio of the non-magnetic metallic element to the whole ranges from about 3 wt % (weight percent) to about 30 wt % (weight percent). In the case where the ratio of the non-magnetic metallic element is lower than 3 wt % (weight percent), it may be difficult to reduce the crystallinity of the second buffer layer 161. In the case where the ratio of the non-magnetic metallic element is higher than 30 wt % (weight percent), the second buffer layer 161 may exhibit an enhanced non-magnetic property, and thus, an exchange coupling between the second junction magnetic layer 162 and the first pinned layer PL1 may be weakened.

Due to the presence of the second buffer layer 161 with low crystallinity, it may be possible to reduce/prevent a crystal structure of the second free layer FL2 from being transferred to the second junction magnetic layer 162 by the thermal treatment process. The second buffer layer 161 may have a crystal structure different from that of the second junction magnetic layer 162. For example, although at least a portion of the second buffer layer 161 has an amorphous structure right after its deposition, it may be crystallized during the thermal treatment process, due to the presence of the second free layer FL2. In example embodiments, the second buffer layer 161 may have an atomic packing factor (APF) higher than that of the second junction magnetic layer 162. For example, at least a portion of the second buffer layer 161 may have a FCC structure, while at least a portion of the second junction magnetic layer 162 may have a BCC structure.

During the thermal treatment process, the second buffer layer 161 may absorb a nonmetallic element (e.g., boron) from the second junction magnetic layer 162, and thus, the second junction magnetic layer 162 may have an enhanced interface anisotropy property. Accordingly, the second buffer layer 161 may have a boron concentration higher than that of the second junction magnetic layer 162.

The second buffer layer 161 may be a non-magnetic layer, whose thickness is less than about half that of the second exchange-coupling layer 106. For example, the second buffer layer 161 may have a thickness of about 5 Å (Angstroms) or less. In example embodiments, the second buffer layer 161 may include an amorphous tantalum layer, an amorphous platinum layer, and/or an amorphous titanium nitride layer. In other embodiments, the second buffer layer 161 may include at least one of the following materials including a ferromagnetic element, a nonmetallic element, and/or a non-magnetic metallic element. Further, the second buffer layer 161 may be configured in such a way that a ratio, in weight percent, of the non-magnetic metallic element to the whole is higher than about 30 wt % (weight percent). For example, the second buffer layer 161 may include a layer of CoFeBTa, in which tantalum (Ta) of about 30 wt % (weight percent) or higher is contained.

Figure 10:
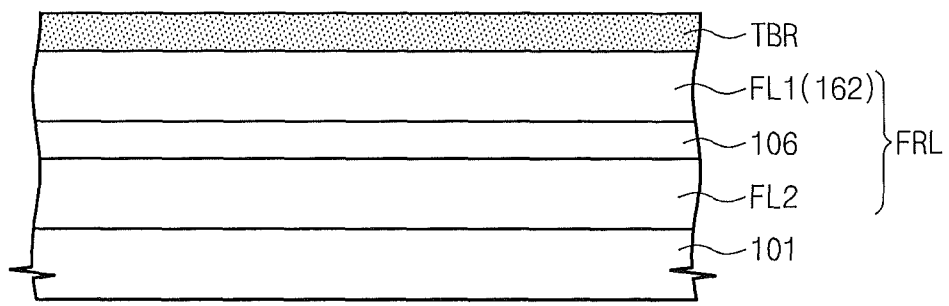
Figure 11:
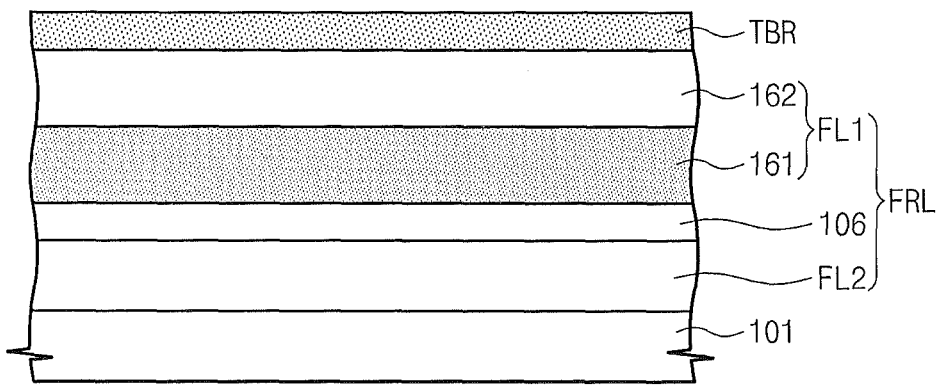

Sectional views of FIGS. 10 and 11 illustrate a free layer constituting the second-type magnetic tunnel junction MTJ2 of FIG. 3. The free magnetic structure FRL may include the second free layer FL2, the second exchange-coupling layer 106, and the first free layer FL1 that are sequentially stacked between the seed layer 101 and the tunnel barrier TBR. The first and second free layers FL1 and FL2 may be antiferromagnetically exchange-coupled to each other through the second exchange-coupling layer 106. Except for a difference in positions of the first and second free layers FL1 and FL2, the first and second free layers FL1 and FL2 may be configured to have substantially the same features as those of the previous embodiments described with reference to FIGS. 8 and 9, and thus, a detailed description thereof may be omitted/reduced.

Figure 12:
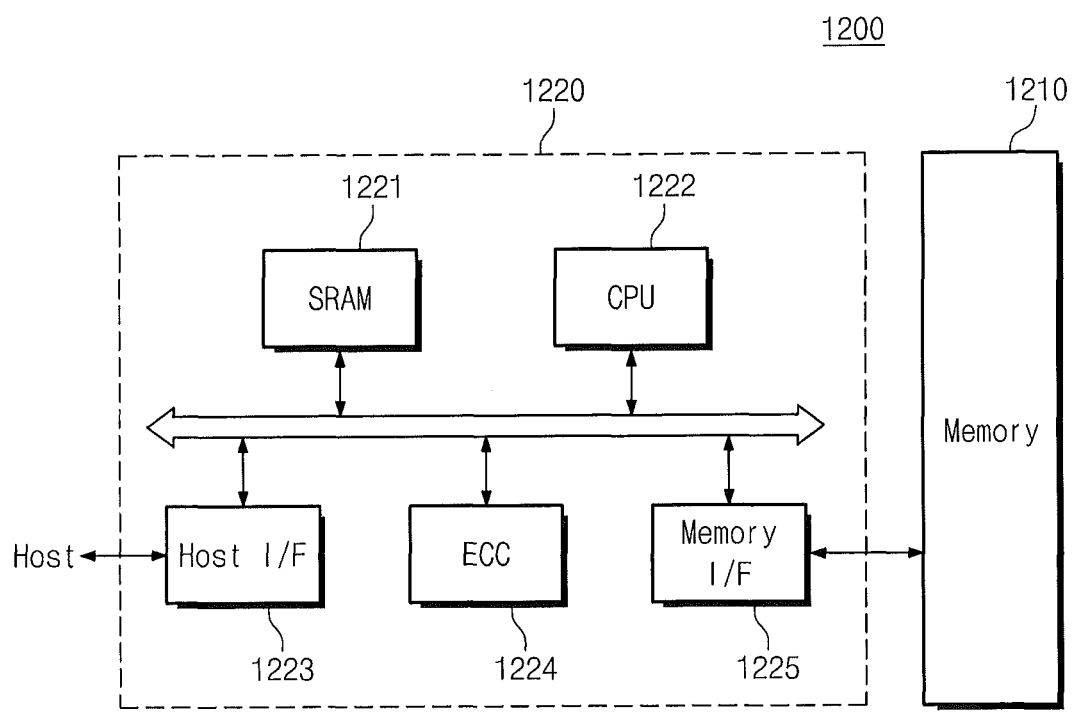
FIGS. 12 and 13 are schematic block diagrams illustrating examples of electronic devices including a semiconductor device according to example embodiments of inventive concepts.
Figure 13:
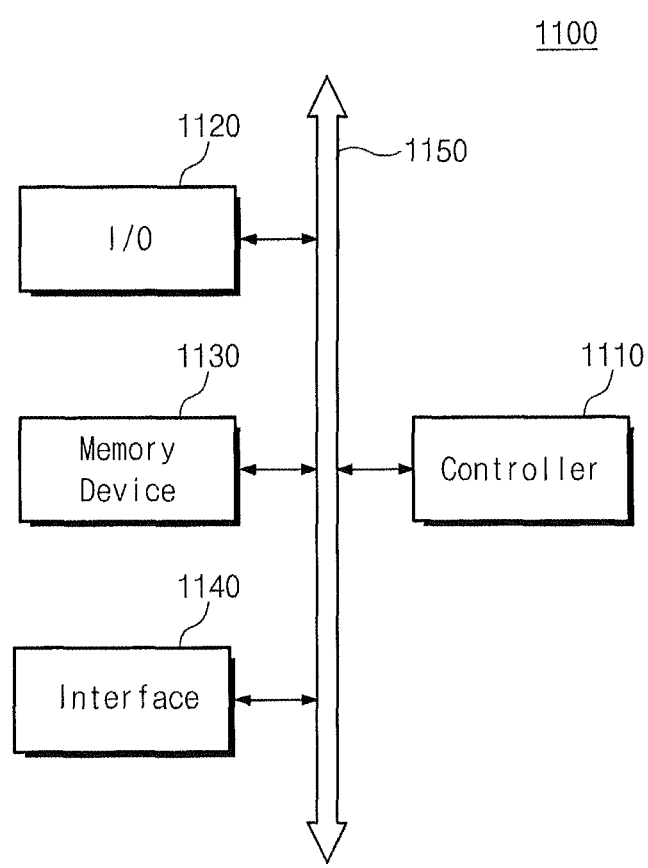

FIGS. 12 and 13 are block diagrams schematically illustrating electronic devices including a semiconductor device according to example embodiments of inventive concepts.

Referring to FIG. 12, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wired or wireless electronic device, or a complex electronic device including a combination of such functionalities. The electronic device 1300 may include a controller 1310, an input/output device(s) 1320 (such as a keypad, a keyboard, a display, etc.), a memory 1330, and/or a wireless interface 1340 that are connected/coupled to each other through a bus 1350. The controller 1310 may include, for example, at least one microprocessor, a digital signal process, a microcontroller, etc. The memory 1330 may be configured to store a command code to be used by the controller 1310 and/or user data. The memory 1330 may include a semiconductor device according to example embodiments of inventive concepts. The electronic device 1300 may use a wireless interface 1340 configured to transmit data to and/or receive data from a wireless communication network using a RF (radio frequency) signal. The wireless interface 1340 may include, for example, an antenna, a wireless transceiver, etc. The electronic system 1300 may be used in a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 13, a memory system including a semiconductor device according to example embodiments of inventive concepts will be described. The memory system 1400 may include a memory device 1410 for storing relatively large quantities of data and a memory controller 1420. The memory controller 1420 controls the memory device 1410 so as to read data stored in the memory device 1410 and/or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, semiconductor memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

According to example embodiments of inventive concepts, magnetic memory devices may be provided having increased magnetoresistance ratios and/or enhanced antiferromagnetic coupling between magnetic layers.

While example embodiments of inventive concepts have been particularly shown and described, it will be understood by one of ordinary skill in the art that variations in form and detail may be made therein without departing from the spirit and scope of the attached claims.

What is claimed is:

1. A magnetic memory device comprising:
a free magnetic structure;
a tunnel barrier layer; and
a pinned magnetic structure wherein the tunnel barrier layer is between the free magnetic structure and the pinned magnetic structure, wherein the pinned magnetic structure includes first and second pinned layers and an exchange coupling layer between the first and second pinned layers, wherein the second pinned layer is between the first pinned layer and the tunnel barrier layer, wherein the second pinned layer includes a junction magnetic layer and a buffer layer between the junction magnetic layer and the exchange coupling layer, and wherein the buffer layer comprises a layer of a material including a non-magnetic metallic element,
wherein the junction magnetic layer and the buffer layer have different crystallization characteristics, and
wherein a degree of crystallinity of the junction magnetic layer is higher than a degree of crystallinity of the buffer layer.

2. The magnetic memory device of claim 1 wherein the non-magnetic metallic element has a higher atomic mass than any element in the junction magnetic layer.

3. The magnetic memory device of claim 1 wherein the non-magnetic metallic element has a higher melting point than any element in the junction magnetic layer.

4. The magnetic memory device of claim 1 wherein a weight percent of the non-magnetic metallic element in the material of the buffer layer is greater than a weight percent of the non-magnetic metallic element in the junction magnetic layer.

5. The magnetic memory device of claim 1 wherein the non-magnetic metallic element comprises at least one of tantalum (Ta), tungsten (W), niobium (Nb), titanium (Ti), chromium (Cr), Hafnium (Hf), Zirconium (Zr), Molybdenum (Mo), and/or vanadium (V).

6. The magnetic memory device of claim 1 wherein the material of the buffer layer further includes a ferromagnetic element and a non-metallic element.

7. The magnetic memory device of claim 6 wherein the ferromagnetic element comprises at least one of cobalt (Co), iron (Fe), and/or nickel, and wherein the non-magnetic element comprises boron.

8. The magnetic memory device of claim 1 wherein the junction magnetic layer has a body centered cubic crystal structure and the buffer layer has an amorphous structure.

9. The magnetic memory device of claim 1 wherein the junction magnetic layer includes at least one of cobalt, iron, and/or alloys thereof.

10. The magnetic memory device of claim 9 wherein the junction magnetic layer includes at least one of CoFeB, CoHf, Co, and/or CoZr.

11. The magnetic memory device of claim 1 wherein the tunnel barrier layer comprises magnesium oxide (MgO).

12. The magnetic memory device of claim 1 wherein the exchange coupling layer includes at least one of ruthenium, iridium, and/or rhodium.

13. The magnetic memory device of claim 1 further comprising:
a substrate wherein the free magnetic structure is between the substrate and the pinned magnetic structure.

14. The magnetic memory device of claim 1 further comprising:
a substrate wherein the pinned magnetic structure is between the substrate and the free magnetic structure.

15. A magnetic memory device comprising:
a free magnetic structure;
a tunnel barrier layer; and
a pinned magnetic structure wherein the tunnel barrier layer is between the free magnetic structure and the pinned magnetic structure, wherein the pinned magnetic structure includes first and second pinned layers and an exchange coupling layer between the first and second pinned layers, wherein the second pinned layer is between the first pinned layer and the tunnel barrier layer, wherein the second pinned layer includes a junction magnetic layer and a buffer layer between the junction magnetic layer and the exchange coupling layer, wherein the junction magnetic layer and the buffer layer have different crystallization characteristics, and wherein the buffer layer has an atomic packing factor (APF) that is higher than that of the junction magnetic layer.

16. The magnetic memory device of claim 15 wherein a degree of crystallinity of the junction magnetic layer is higher than a degree of crystallinity of the buffer layer.

17. The magnetic memory device of claim 16 wherein the junction magnetic layer has a body centered cubic crystal structure and the buffer layer has an amorphous structure.

18. The magnetic memory device of claim 15 wherein the junction magnetic layer includes at least one of cobalt, iron, and/or alloys thereof.

19. The magnetic memory device of claim 18 wherein the junction magnetic layer includes at least one of CoFeB, CoHf, Co, and/or CoZr.

20. The magnetic memory device of claim 18 wherein the buffer layer comprises a layer of a material including a non-magnetic metallic element, a ferromagnetic element, and a non-metallic element.

21. The magnetic memory device of claim 20 wherein a weight percent of the non-magnetic metallic element in the material of the buffer layer is greater than a weight percent of the non-magnetic metallic element in the junction magnetic layer.

22. The magnetic memory device of claim 20 wherein the non-magnetic metallic element has an atomic mass that is greater than an atomic mass of cobalt.

23. The magnetic memory device of claim 20 wherein the non-magnetic metallic element comprises at least one of tantalum (Ta), tungsten (W), niobium (Nb), titanium (Ti), chromium (Cr), Hafnium (Hf), Zirconium (Zr), Molybdenum (Mo), and/or vanadium (V).

24. The magnetic memory device of claim 20 wherein the ferromagnetic element comprises at least one of cobalt (Co), iron (Fe), and/or nickel, and wherein the non-metallic element comprises boron.

25. The magnetic memory device of claim 15 wherein the tunnel barrier layer comprises magnesium oxide (MgO).

26. The magnetic memory device of claim 15 wherein the exchange coupling layer includes at least one of ruthenium, iridium, and/or rhodium.

27. The magnetic memory device of claim 15 further comprising:
a substrate wherein the free magnetic structure is between the substrate and the pinned magnetic structure.

28. The magnetic memory device of claim 15 further comprising:
a substrate wherein the pinned magnetic structure is between the substrate and the free magnetic structure.

29. The magnetic memory device of claim 15, wherein the buffer layer and the junction magnetic layer comprise boron, and the buffer layer has a boron concentration that is higher than that of the junction magnetic layer.

30. The magnetic memory device of claim 15, wherein the buffer layer has a higher density than the junction magnetic layer.

* * * * *